United States Patent
Long

(10) Patent No.: US 7,531,061 B2
(45) Date of Patent: May 12, 2009

(54) GAS TEMPERATURE CONTROL FOR A PLASMA PROCESS

(75) Inventor: Maolin Long, Tempe, AZ (US)

(73) Assignee: Tokyo Electron Limited, Tokyo (JP)

(*) Notice: Subject to any disclaimer, the term of this patent is extended or adjusted under 35 U.S.C. 154(b) by 129 days.

(21) Appl. No.: 10/940,019

(22) Filed: Sep. 14, 2004

(65) Prior Publication Data

US 2005/0028736 A1     Feb. 10, 2005

Related U.S. Application Data

(62) Division of application No. 10/173,671, filed on Jun. 19, 2002, now Pat. No. 6,811,651.

(60) Provisional application No. 60/299,725, filed on Jun. 22, 2001.

(51) Int. Cl.
  H01L 21/00    (2006.01)
  C23C 16/00    (2006.01)
  C23F 1/00     (2006.01)
  F25B 29/00    (2006.01)

(52) U.S. Cl. ............... 156/345.27; 156/345.29; 156/345.33; 156/345.34; 118/715; 118/666; 118/712; 165/58; 165/61

(58) Field of Classification Search .......... 118/715–733
See application file for complete search history.

(56) References Cited

U.S. PATENT DOCUMENTS

| | | | |
|---|---|---|---|
| 5,000,113 A | 3/1991 | Wang et al. | |
| 5,186,120 A * | 2/1993 | Ohnishi et al. | 118/667 |
| 5,383,970 A | 1/1995 | Asaba et al. | |
| 5,431,733 A | 7/1995 | Shibuya et al. | |
| 5,505,778 A | 4/1996 | Ono et al. | |
| 5,595,606 A | 1/1997 | Fujikawa et al. | |
| 5,690,743 A | 11/1997 | Murakami et al. | |
| 5,730,804 A | 3/1998 | Gomi et al. | |
| 5,785,796 A | 7/1998 | Lee | |
| 5,840,368 A | 11/1998 | Ohmi | |
| 5,882,416 A | 3/1999 | Van Buskirk et al. | |

(Continued)

FOREIGN PATENT DOCUMENTS

JP          63-100734          5/1988

(Continued)

OTHER PUBLICATIONS

John Stevenson, Control Principles in Process/Industrial Instruments and Control Handbook (McGraw Hill 1999).*

*Primary Examiner*—Ram N. Kackar
(74) *Attorney, Agent, or Firm*—Oblon, Spivak, McClelland, Maier & Neustadt, P.C.

(57) ABSTRACT

A method and system for controlling the temperatures of at least one gas in a plasma processing environment prior to the at least one gas entering a process chamber. This temperature control may vary at different spatial regions of a showerhead assembly (either an individual gas species or mixed gas species). According to one embodiment, an in-line heat exchanger alters (i.e., increases or decreases) the temperature of passing gas species (either high- or low-density) prior to entering a process chamber, temperature change of the gases is measured by determining a temperature of the gas both upon entrance into the in-line heat exchanger assembly and upon exit.

6 Claims, 7 Drawing Sheets

U.S. PATENT DOCUMENTS

| | | |
|---|---|---|
| 6,074,487 A | 6/2000 | Yoshioka et al. |
| 6,110,283 A | 8/2000 | Yamamuka et al. |
| 6,117,245 A | 9/2000 | Mandrekar et al. |
| 6,190,459 B1 | 2/2001 | Takeshita et al. |
| 6,332,927 B1 | 12/2001 | Inokuchi et al. |
| 6,433,314 B1 | 8/2002 | Mandrekar et al. |
| 6,444,042 B1 * | 9/2002 | Yang et al. .................. 118/724 |
| 6,451,692 B1 * | 9/2002 | Derderian et al. ........... 438/680 |
| 6,453,992 B1 * | 9/2002 | Kim ........................... 165/206 |
| 6,454,860 B2 * | 9/2002 | Metzner et al. .............. 118/715 |
| 6,473,993 B1 * | 11/2002 | Yagi et al. ..................... 34/380 |
| 6,482,266 B1 * | 11/2002 | Matsumoto et al. ......... 118/715 |
| 2002/0094306 A1 | 7/2002 | Hara et al. |
| 2002/0153350 A1 * | 10/2002 | Lu et al. ........................ 216/67 |
| 2003/0084848 A1 | 5/2003 | Long |

FOREIGN PATENT DOCUMENTS

| | | |
|---|---|---|
| JP | 01-257337 | 10/1989 |
| JP | 03-281780 | 12/1991 |
| JP | 9-232298 | 9/1997 |

* cited by examiner

200

300

500

SECT. A-A

500

GAS TEMPERATURE CONTROL FOR A PLASMA PROCESS

CROSS REFERENCE TO RELATED APPLICATIONS

This application is a divisional of application Ser. No. 10/173,671, filed Jun. 19, 2002, which claims priority to U.S. Provisional Application Ser. No. 60/299,725, filed Jun. 22, 2001, the contents of each application are incorporated herein by reference.

BACKGROUND OF THE INVENTION

1. Field of the Invention

The present invention is directed to a method and system for controlling a gas temperature in a plasma processing environment.

2. Discussion of the Background

Plasma reactors are being constructed with increasingly tight process controls. Plasma processes involve dissociating the molecules in the gas within the process chamber using an RF electric field. Dissociation within the plasma creates positively charged ions, free electrons, and neutrals. These particles interact with the wafer and with each other. These interactions are governed by chemical principles. One dominant factor governing these reactions is temperature. Temperature control systems exist to regulate the temperature of wafers when they are on a wafer chuck in a reactor being etched.

U.S. Pat. No. 5,653,808, entitled "Gas injection system for CVD reactors," describes a CVD reactor that includes separate reaction and pressure chambers, where the reaction chamber is contained within and isolates reactant gases from the pressure chamber. The reactor also includes a gas injection system that injects process gas(es) (e.g., hydrogen) into the reaction chamber in a somewhat vertical direction through a bottom surface of the reaction chamber.

The flow of the gas is intermediate the flow of the process gas(es) and a surface of the reaction chamber, thereby redirecting the process gas flow parallel to the top surface of a wafer therein. In this manner, the reaction chamber does not require a long entry length for the process gas(es).

U.S. Pat. No. 5,911,834, entitled "Gas delivery system" and assigned to Applied Materials Inc. (Santa Clara, Calif.), describes a method and apparatus for delivering at least one process gas and at least one cleaning gas into at least one processing region. The gas distribution system includes a gas inlet and a gas conduit, each disposed to deliver at least one gas into the chamber via a desired diffusing passage. Also, a gas delivery method and apparatus for splitting a gas feed into multiple feed lines is provided having a gas filter disposed upstream from a splitting coupling disposed in the line.

U.S. Pat. No. 6,030,456, entitled "Installation to supply gas" and assigned to Winbond Electronics Corp. (Hsinchu, TW), describes an adjustable gas supply in a reaction chamber according to the conditions in the reaction chamber. The installation comprises sensors, a gas-supplying panel and a driving device. The sensors are located in the reaction chamber to sense the conditions in the reaction chamber. The gas-supplying panel has a plurality of asymmetrically located apertures and gas is supplied through these apertures. The driving device, coupled to the sensors and the gas-supplying panel, drives the gas-supplying panel to respond to the conditions sensed by the sensors, in which the gas-supplying panel can adjust the positions of the gas supplied through the apertures.

U.S. Pat. No. 6,068,703, entitled "Gas mixing apparatus and method" and assigned to Applied Materials, Inc. (Santa Clara, Calif.), describes apparatuses, systems, and methods related to the manufacture of integrated circuits. Specifically, embodiments include apparatus designed to provide mixture for gases used in a semiconductor processing system. In one embodiment, the gas mixing apparatus includes a gas mixer housing having a gas inlet, a fluid flow channel, and a gas outlet. The fluid flow channel is fluidly coupled to a plurality of gas sources. The majority of the gas mixture occurs in the fluid flow channel which includes one or more fluid separators for separating the gas into plural gas portions and one or more fluid collectors for allowing the plural gas portions to collide with each other to mix the gas portions.

U.S. Pat. No. 6,071,349, entitled "Gas supplying apparatus and vapor-phase growth plant" and assigned to Shin-Etsu Handotai Co. Ltd. (Tokyo, JP), describes a vapor-phase growth plant which has a dopant gas supplying apparatus including plural dopant gas supplying containers, and a multiple stage gas flow subsystem with plural dopant gas supply conduits therein. The dopant gas supply conduits form a tournament-style network with a plurality of confluences on which the dopant gas supply conduits are united and the gas flows therein are merged for subjection to mixing which results in a decreasing number of dopant gas supply conduits as the dopant gas flows proceed in the multiple stage gas flow subsystem.

The above discussed patents solve some temperature related problems, however, the temperatures of gases entering the process chamber during the etching process are not controlled.

SUMMARY OF THE INVENTION

It is an object of the present invention to extend the range of etching process recipes by providing control of the temperatures of the gases. Generally the present invention is directed to a method of controlling the temperature of at least one gas prior to the gas entering a process chamber. Temperature controllers can also be used to vary gas temperatures at different spatial regions of a showerhead assembly (either an individual gas species or mixed gas species).

According to one embodiment, an in-line heat exchanger alters (i.e., increases or decreases) the temperature of passing gas species (either high- or low-density) prior to entering a process chamber, temperature change of the gases is measured by determining a temperature of the gas both upon entrance into the in-line heat exchanger assembly and upon exit. This enables tracking of the operation of the system configuration by a gas temperature control system and prediction of what will happen in the process chamber. Depending on the desired reactant gas mixture, gas species can be heated or cooled to different temperatures before being mixed and subsequently dispersed into a process chamber.

In at least one embodiment, the present invention increases at least one performance characteristic (e.g., etch rate, uniformity, selectivity, ease of chamber cleaning, and various plasma properties).

BRIEF DESCRIPTION OF THE DRAWINGS

A more complete appreciation of the present invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
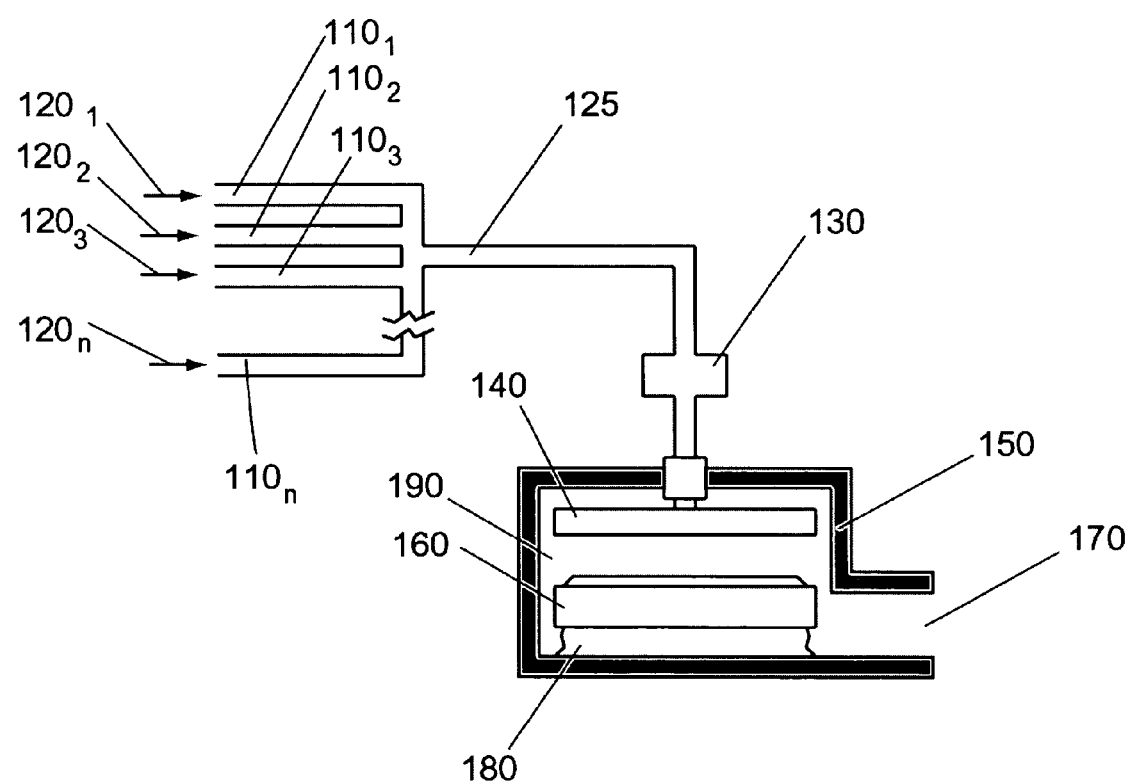
FIG. 1 is a schematic illustration of a plasma processing system with gas temperature control according to a first embodiment.

Referring now to the drawings, wherein like reference numerals designate identical or corresponding parts throughout the several views, FIG. 1 shows a first gas temperature-control embodiment 100 that includes first gas line 110$_1$, second gas line 110$_2$, third gas line 110$_3$, and nth gas line 110$_n$, temperature controller (T/C) 130, process chamber 190 (e.g., a conventional plasma-etching chamber), showerhead 140, chamber wall 150, chuck 160, pump port 170, and bellows 180.

Gases 120$_1$, through 120$_2$, are gases used to process wafers. Examples of such gases include HBr, $SF_6$ or $Cl_2$ diluted with Ar for silicon etch; $C_4F_8$, $C_5F_8$ or $CF_4$ diluted with Ar for oxide (e.g., $SiO_2$ etch); $SiH_4$ or $SiCl_2H_2$, and $CO_2$ and $H_2O$, or $N_2O$ for oxide (e.g., $SiO_2$) deposition; $Si(OC_2H_5)$ for oxide deposition; $BCl_3$, $Cl_2$, $SF_6$, $CF_4$, $CFCl_3$, $CF_2Cl_2$, $CF_3Cl$, $CHF_3$ or $C_2ClF_5$ for metal etch; $NH_3$, $N_2$, $AsH_3$, $B_2H_6$, KCl $PH_3$, $WF_6$ and $SiH_4$ for chemical vapor deposition (CVD) applications; or $O_2$ for ashing (resist removal) processes. A typical set of gases employed for oxide etching includes Ar, $C_4F_8$, (CO) and $O_2$.

Gas lines 110$_1$ through 110$_n$ are channels, preferably constructed of metal (e.g., single or double-wall stainless steel tubing) through which gases 120$_1$ through 120$_n$ travel before combining in neck 125. Neck 125 serves to homogeneously mix gases prior to entering process chamber 190.

The system further includes temperature controller 130 and showerhead 140. Temperature controller 130 preferably is capable of both raising and lowering the temperature of gas passing through it, not only to preset constant levels, but also in response to dynamic and time varying temperature trajectories. An exemplary temperature controller 130 is disclosed in additional detail in FIGS. 5 and 6. As illustrated in FIG. 1, showerhead 140 comprises a plate that includes a plurality of gas injection holes spaced in such a manner as to allow a controlled distribution of process gas introduction to the process chamber 190 above the wafer.

Chamber wall 150 is the wall of the process chamber 190 that serves to contain a vacuum that supports formation of a plasma during device processing. Chamber walls are generally fabricated from aluminum and either anodized, spray coated with a protective coating such as $Y_2O_3$ or clad with protective chamber liners (e.g., silicon, quartz, silicon carbide, boron carbide and alumina) in order to avoid direct contact between the (aluminum) chamber walls and the plasma.

Chuck 160 serves to hold and clamp a substrate (e.g., a liquid crystal display or a wafer of semiconductor material), and also serves to confine a thin layer of helium gas to drain heat from the substrate during plasma-etch fabrication steps. The clamping force can be applied to the substrate via an electrostatic clamp electrode embedded within the chuck and biased to attract the substrate to the chuck 160. Gas (e.g., Helium) is supplied to the backside of the substrate in order to improve the thermal contact between the substrate backside and the chuck upper surface.

Pump port 170 is a passageway through which gases are purged from the process chamber 190. Pump port 170 is preferably attached to a vacuum pump (e.g., a turbo-molecular vacuum pump (TMP) capable of pumping speed in excess of 5000 liters per second). In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump is recommended.

Bellows 180 is a circular, compressible metal element. Prefabricated bellows are well known to the industry and are commonly available from suppliers such as Senior Flexonics, Inc., Metal Bellows Division (536 Sandy Oaks Boulevard, Ormond Beach, Fla. 32174). An exemplary bellow suitable for a chuck useful in 200 mm substrate processing might be Model number DD-01-00001-83.

The elements of FIG. 1 are interconnected as follows. For each i, where $1 \leq i \leq n$, gas 120$_i$ is supplied to gas line 110$_i$ (e.g., gas 120$_1$ is supplied to first gas line 110$_1$), each through an independent mass flow controller. The n gas lines combine at neck 125. Neck 125 extends between the confluence of the plurality of gas lines and the showerhead 140 included in process chamber 190. Process chamber 190 is enclosed by chamber wall 150 and further includes chuck 160 and bellows 180. Pump port 170 is attached to chamber wall 150. T/C 130 is located along neck 125.

In operation, a production substrate (not shown) is placed on chuck 160 within process chamber 190 such that the surface of the substrate to be etched (or to which material is deposited) faces the showerhead 140. The substrate etching process takes place according to a process recipe selected for the substrate. The substrate is heated or cooled to a prescribed process temperature. In accordance with flow rates given by the process recipe, gases 120$_1$ through 120$_n$ flow through gas lines 110$_1$ through 110$_n$, combine in neck 125 and flow through T/C 130 where their combined temperature is changed. The combined gases continue along neck 125 and enter into process chamber 190 via showerhead 140, where the combined gas is applied uniformly to the process chamber 190. Once inside process chamber 190, electrodes driven by a radio-frequency (RF) source (not shown) excite the combined gases. The electrodes and source, in combination, generate a discharge between the electrodes to ionize reactive gases therein. These ionized gases form a plasma that deposits film onto, or etches film off of, the substrate in contact with the plasma. Successive exposures to differing plasmas create desirable semiconductor films on the substrate. Similarly, coatings or films can be selectively removed if exposed to plasmas formed by appropriate etch gases (e.g., carbon tetrafluoride).

Figure 2:
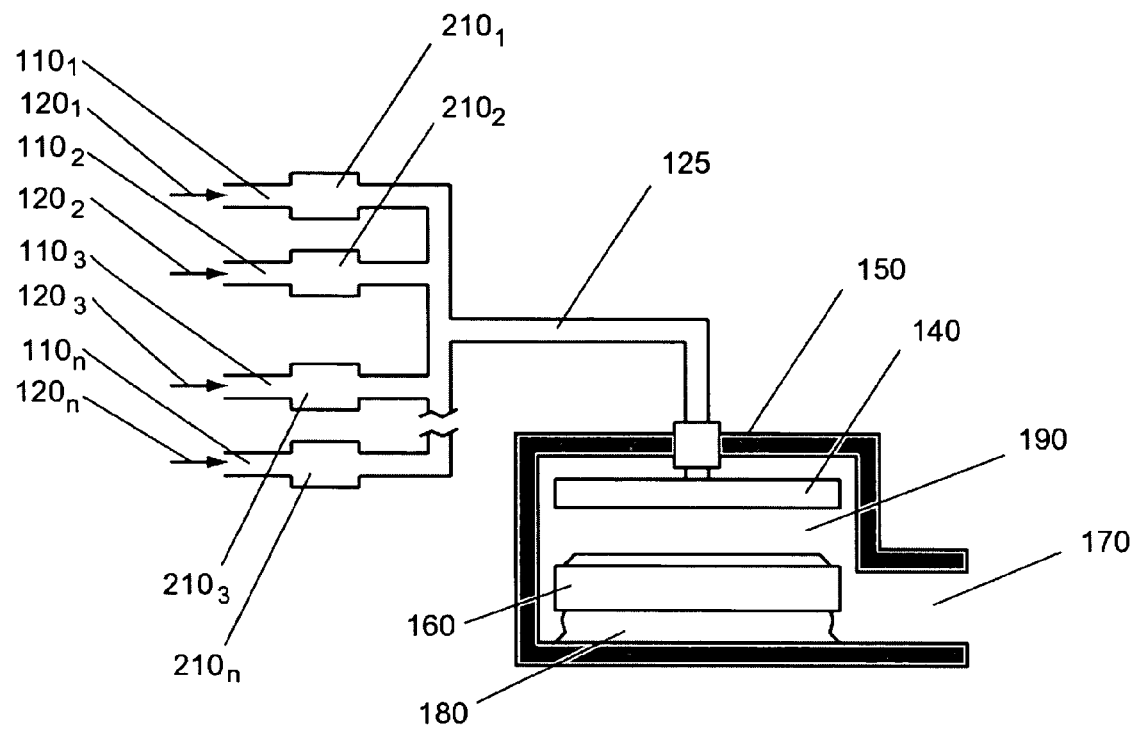
FIG. 2 is a schematic illustration of a plasma processing system with gas temperature control according to a second embodiment.

FIG. 2 shows a second gas temperature-control embodiment 200 that includes a neck 125, process chamber 190, chamber wall 150, showerhead 140, chuck 160, bellows 180, and pump port 170, as in FIG. 1, and are not further described. However, the single T/C 130 has been replaced by dedicated species temperature controllers (T/C $210_1$ through T/C $210_n$) for each of the gas lines $110_1$ through $110_n$. T/C $210_1$ through $210_n$ are temperature controllers that separately control the temperature of individual gases, and are explained in further detail in FIGS. 5 and 6.

In operation, for each i in $1 \leq i \leq n$, gas $120_i$ enters its corresponding gas line $110_i$ and passes through T/C $210_i$, which heats gas $120_i$ to a predetermined temperature $T_i$. The species of gases continue through their respective gas lines, combine at neck 125, and proceed further to process chamber 190.

Figure 3:
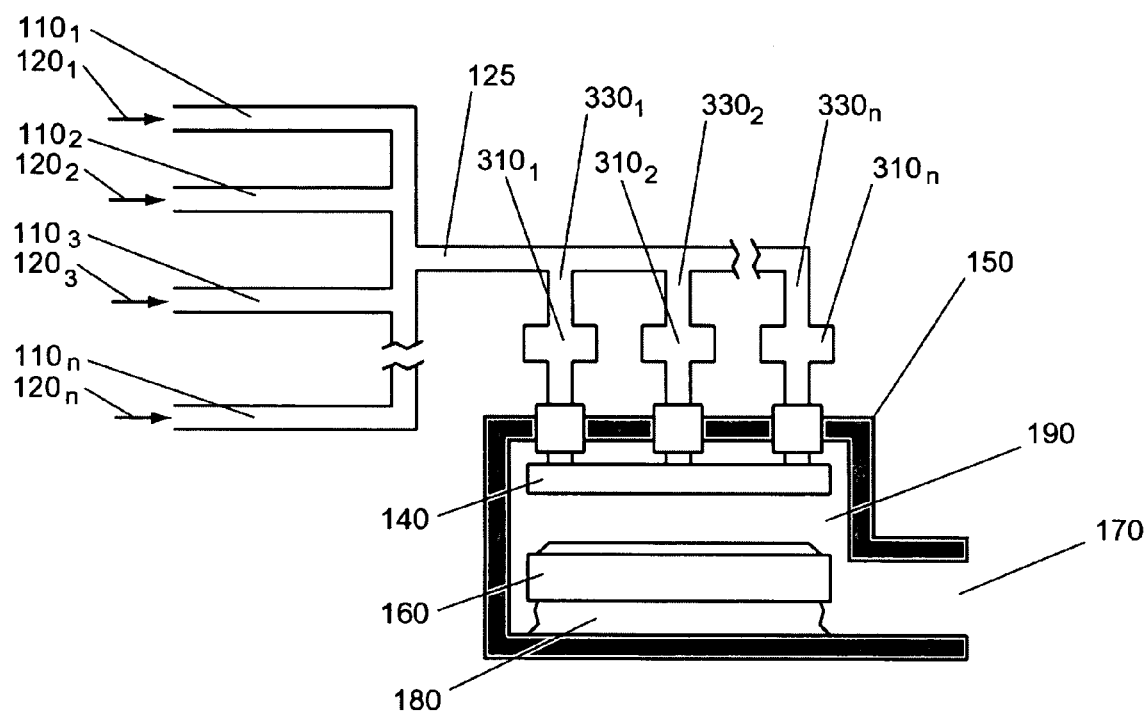
FIG. 3 is a schematic illustration of a plasma processing system with gas temperature control according to a third embodiment.

FIG. 3 shows a third gas temperature-control embodiment 300 that, like FIG. 1, includes gas lines $110_1$ through $110_n$, neck 125, process chamber 190, chamber wall 150, shower head 140, chuck 160, bellows 180, and pump port 170. Embodiment 300 further includes spatial temperature controllers $310_1$ through $310_m$ that alter the temperatures of mixed gas species prior to the introduction of the mixed gas species into the process chamber 190. (The number, m, of temperature controllers, need not equal the number of lines, n, (i.e., n≠m), but they may be made equal (i.e., n=m).) Each T/C $310_i$ includes a corresponding inlet $330_i$ and connects neck 125 with differing spatial regions of showerhead 140.

In operation, each gas $120_i$ flows through gas line $110_i$ and into neck 125. Within neck 125, gases $120_1$ through $120_n$ combine to form a process gas mixture. The process gas mixture flows through inlets $330_1$ through $330_n$ and, correspondingly, into T/C $310_1$ through T/C $310_m$ where each T/C $310_1$ heats a portion of the process gas to a predetermined temperature. Upon passing through T/C $310_1$ through T/C $310_m$ the heated process gas flows through the different spatial areas on showerhead 140. In the illustrated embodiment, showerhead 140 is divided into a plurality of isolated areas and the temperature of mixed gas species is controlled for each of the plurality of isolated areas of showerhead 140.

Figure 4:
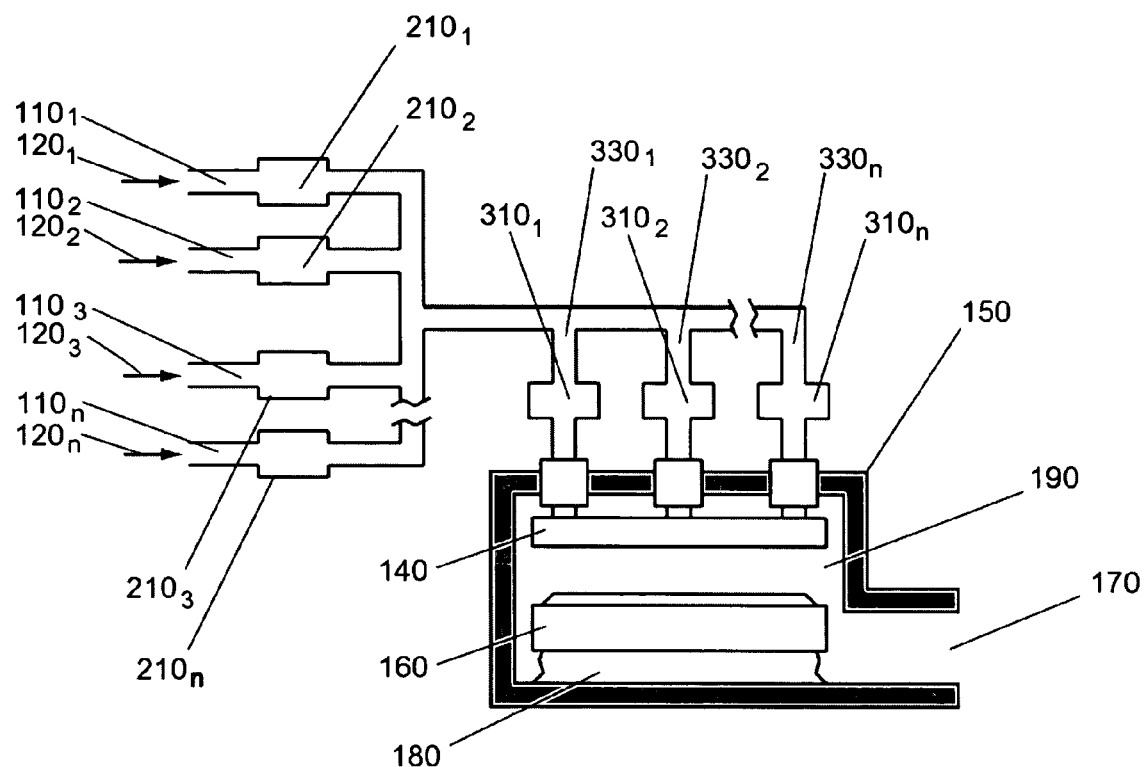
FIG. 4 is a schematic illustration of a plasma processing system with gas temperature control according to a fourth embodiment.

FIG. 4 shows a fourth gas temperature-control embodiment that, like FIG. 1, includes gas lines $110_1$ through $110_n$, neck 125, process chamber 190, chamber wall 150, shower head 140, chuck 160, bellows 180, and pump port 170. FIG. 4 also includes the species temperature controllers $210_1$ through $210_n$ and the spatial temperature controllers $310_1$ through $310_m$, thereby forming a hierarchy of temperature controllers.

In operation, the temperature of each gas is first controlled individually with a temperature controller located along each individual gas line. Subsequently, the temperature of the mixed gas species is controlled at different spatial areas on showerhead 140. As would be understood by one of ordinary skill in the art, multiple individual species temperature controllers (e.g., T/C $210_i$ and T/C $210_{i+1}$) can be combined into a larger T/C 210' without a loss of generality. Similarly, multiple temperature controllers (e.g., T/C $310_i$ and T/C $310_{i+1}$) can be combined without a loss of generality.

Figure 5:
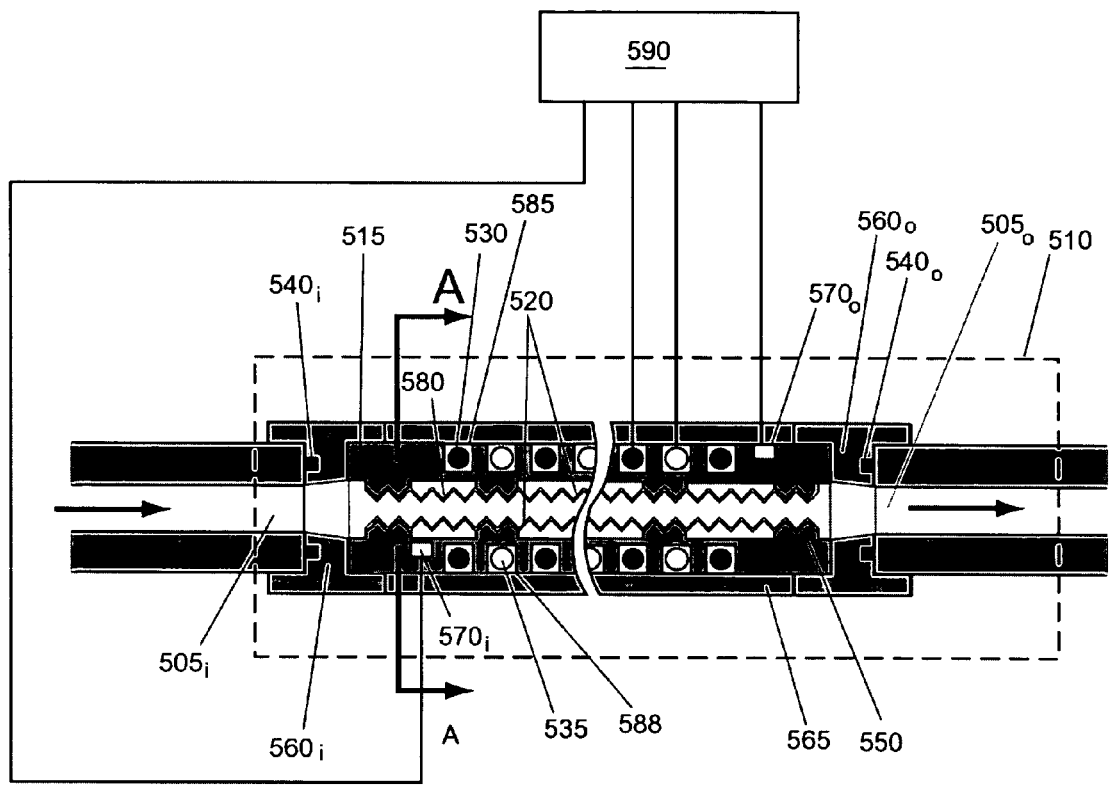
FIG. 5 is a side cross section of a temperature controller.

FIG. 5 shows gas temperature controller 500 that includes inlet pipe $505_i$, outlet pipe $505_o$, in-line heat exchanger assembly 510, heater 585, cooler 588, and control unit 590. In-line heat exchanger assembly includes heat conductor 515 (e.g., a metal conductor), gas through-channel 520, heating element 530, cooling element 535, inlet side O-ring $540_i$, outlet side O-ring $540_o$, membrane support 550, inlet side insulation $560_i$, outlet side insulation $560_o$, inlet side temperature sensor $570_i$, outlet side temperature sensor $570_o$, and thermal transfer membrane 580.

Pipe $505_i$ and pipe $505_o$ are pipes (e.g., stainless steel pipes) for passing incoming and outgoing gases, respectively, of the gas temperature controller 500.

Control unit 590 comprises a computer controller with memory to store process instructions and interface for coupling to a higher level controller such as a process controller. One example of controller 590 is a Model # SBC2486DX PC/104 Embeddable Computer Board commercially available from Micro/sys, Inc., 3730 Park Place, Glendale, Calif. 91020.

A first embodiment for heater 585 is an electrical resistance heater wherein heating element 530 comprises a helical coil (or strip) fabricated from a material of high resistivity. Such resistance heaters have typically employed heating elements of a nickel-chromium alloy (nichrome) or an aluminum-iron alloy, which are electrically resistive and which generate heat when an electrical current is applied through the elements. Examples of commercially available materials commonly used to fabricate resistive heating elements employed in ovens are Kanthal, Nikrothal and Alkrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). Additional materials include tungsten or platinum. Furthermore, heater unit 585 can comprise a DC or AC power supply capable of delivering a current to the resistive heater element 530. An exemplary heater power supply is a switch-mode programmable DC power supply such as the SPS series commercially available from American Reliance, Inc. (11801 Goldring Road, Arcadia, Calif. 91006). DC power supplies can be ganged in parallel or series in order to increase current and/or voltage, and power delivered to the heating element 530. Heater 585 can be controlled through instructions sent from controller 590.

A first embodiment for cooler 588 is a forced convection coolant loop wherein cooling element 535 comprises a helical tube or channel through which a coolant fluid of prescribed temperature and flow rate passes. The coolant can be cooled (or heated) water, ethylene glycol, liquid nitrogen, etc. Through commands sent by the controller 590, cooler 588 adjusts the coolant temperature and/or flow rate.

In-line heat exchanger assembly 510 is an actively controlled heater/cooler that has heating and cooling elements described in detail below and configured to heat or cool a gas passing through in-line heat exchanger assembly 510. In-line heat exchanger assembly 510 is designed with various lengths, with longer in-line heat exchanger assemblies 510 capable of achieving a larger change in gas temperature due to a greater heat transfer surface area contained therein and explained below. A typical length for the in-line heat exchanger can be from 10 cm to several meters for current applications.

Gas through-channel 520 is the cavity within in-line heat exchanger assembly 510 through which and around which gas passes as it is heated or cooled.

Heat conductor 515 (e.g., made of metal such as stainless steel, copper, aluminum) is formed with a corrugated interior surface, thus increasing the surface "wetted" area that passing gas comes in contact with while traversing gas through-channel 520 and maximizing heat transfer to and from the gas. The gas is heated by heating element 530 or cooled by cooling element 535 in accordance with process recipe instructions stored in the memory in control unit 590. A thermal exchange of energy occurs, via conduction and convection, within and around gas through-channel 520 between the passing gas and heat conductor 515, membrane supports 550, and thermal transfer membrane 580.

Inlet side O-ring $540_i$ provides a seal between inlet pipe $505_i$ and in-line heat exchanger 510. Likewise, outlet side O-ring $540_o$ provides a seal between outlet pipe $505_o$ and in-line heat exchanger 510. O-rings $540_i$ and $540_o$ further allow thermal contraction of the elements of the in-line heat exchanger 510, including heat conductor 515.

Membrane support 550 is made of a metal (e.g., stainless steel, copper, or aluminum), supports the thermal transfer membrane 580, and provides a medium of heat conduction between heat conductor 515 and thermal transfer membrane 580.

Inlet and outlet side insulation $560_i$ and $560_o$ (e.g., quartz) serve to prevent thermal conduction to elements outside the in-line heat exchanger assembly 510. The inlet-side insulator $560_i$ can have a conically divergent gas flow-through section to act as a diffuser (flow decelerating device), and the outlet side insulator $560_o$ can have a conically convergent gas flow-through section to act as a nozzle (flow accelerating device).

Mid-section insulation 565 (e.g., quartz) serves to prevent heat transfer between heat conductor 515 and the environment surrounding the in-line heat exchanger 510. The fabrication of insulators $560_i$, 565 and $560_o$ from quartz serves to assemble a casing for the in-line heating/cooling device with low thermal conductivity and small coefficient of thermal expansion, but other insulating materials may also be used. The heat conducting structure 515 can be fabricated to reside within insulating structures with sufficient clearance to accommodate differing coefficients of thermal expansion.

Inlet-side and outlet-side temperature sensors $570_i$ and $570_o$, respectively, sense gas temperatures and provide feedback to control unit 590. Inlet-side temperature sensor $570_i$ is located within gas line section $505_i$ for the purpose of sensing the temperature of incoming gas. Outlet-side temperature sensor $570_o$ is located within gas line $505_o$ for the purpose of sensing the temperature of outgoing gas. In an alternative embodiment, temperature is sensed in upstream and downstream regions of in-line heat exchanger assembly, which is insulated from conducting structure 515. In one embodiment, temperature sensors $570_i$ and $570_o$ are K-type thermocouples.

Thermal transfer membrane 580 is a corrugated membrane (e.g., stainless steel, copper or aluminum) and improves thermal transfer between the gas species and the heat conductor 515 by exposing the gas to a large heat transfer surface area. Moreover, the thermal transfer membrane 580 can be formed by an array of concentric (tubular) fins held fixed by the membrane supports 550 and extending the length of the in-line gas heat exchanger 510. In general, surfaces of thermal transfer membrane 580, membrane support 550, and heat conductor 515 can be coated with a protective coating to minimize gas contamination at elevated temperatures. For example, materials can be embedded within quartz, spray coated or anodized.

One embodiment of heating element 530 is a helically wound resistive heating element that provides thermal energy to heat conductor 515 in proportion to the amount of power supplied to heating element 530 by heater 585.

One embodiment of cooling element 535 is a helically wound element controlled by controller 590, through which a coolant gas or liquid passes. Heating element 530 and cooling element 535 together form a double helix.

The elements of temperature controller 500 are interrelated as follows. Control unit 590 is in communication with temperature sensors $570_i$ and $570_o$, heater 585 and cooler 588. Heater 585 is in communication with heating element 530, and cooler 588 is in communication with cooling element 535. In-line heat exchanger assembly 510 is disposed between pipes $505_i$ and $505_o$. Insulation $560_i$, 565 and insulation $560_o$ encase the inner elements of in line heat exchanger assembly 510, including heat conductor 515, O-rings $540_i$ and $540_o$, and gas lines $505_i$ and $505_o$. Heat conductor 515 encases heating element 530, cooling element 535, and temperature sensors $570_i$ and $570_o$. Heat conductor 515 is in thermal contact with membrane support 550, which is in thermal contact with thermal transfer membrane 580. Membrane support 550 and heat transfer membrane form a gas through-channel 520.

In operation, gas enters temperature controller 500 through gas line $505_i$ and passes through temperature controller 500 along and around gas through-channel 520. Temperature sensors $570_i$ and $570_o$ are located within heat conductor 515 such that temperature sensor $570_i$ is capable of sensing the temperature of incoming gas species and temperature controller $570_o$ is capable of sensing the temperature of outgoing gas species. Temperature sensors $570_i$ and $570_o$ relay this temperature information to control unit 590 (periodically, continually, or when polled). Control unit 590 senses the temperature of in-line heat exchanger 510 and compares the measured temperature with the desired temperature in the process recipe stored in the memory in control unit 590. Control unit 590 then communicates with heater 585 or cooler 588, which activate heating element 530 or cooling element 535 in accordance with the process recipe. Conductive heat transfer occurs between heating element 530 and heat conductor 515. Conductive-convective heat transfer occurs between cooling element 535 and heat conductor 515. A transfer of thermal energy occurs, via conduction, between heat conductor 515 and membrane supports 550 and thermal transfer membrane 580. In conjunction with a known gas mass flow rate (via a mass flow rate controller upstream of the in-line heat exchanger assembly 510) and known species composition, the heat transferred to or from the gas can be computed as a function of power delivered to heating element 530 or flow rate and temperature of coolant in cooling element 535. Membrane supports 550 and thermal transfer membrane are designed with a large "wetted surface area" (the "wetted surface area" is the total surface area in contact with the gas; e.g. a momentum and thermal boundary layer exists at these surfaces through which thermal energy is transported) as described above. Gas passing through gas through-channel 520 comes in thermal contact with the surfaces of thermal transfer membrane 580 and membrane supports 550 and a transfer of thermal energy occurs via conduction and convection.

In-line heat exchanger 510 is designed with an application-specific length that ranges between 10 cm and several meters. For example, an in-line heat exchanger 510 of total length 22 cm and inner diameter of 4 cm would be suitable for heating gas from 300K to 800K (or the structure temperature). An exemplary in-line heat exchanger (low-density gas heater/cooler) 510 includes three sections, namely, an inlet diffuser of length 6 cm, a gas heating/cooling section of length 10 cm and an exit nozzle section of length 6 cm. The inlet diffuser is a conically divergent duct section (preferably having a half-angle not to exceed 18 degrees) utilized to increase the flow-through cross-sectional area without flow separation. A diffuser length of 5.42 cm (or 6 cm) is sufficiently long (per the specification above) to increase the inner pipe diameter from 0.476 cm (3/16 inch inner diameter is typical for gas line plumbing) to 4 cm. If the diffuser half-angle is less than 18 degrees, then the flow will remain attached to the walls; however, if the angle exceeds 18 degrees, it is possible that the gas flow will separate from the walls in the diffuser and reduce gas heating/cooling efficiency. The diffuser serves the primary purpose of slowing the gas flow and expanding the flow cross-section so that the amount of "wetted" surface area within the in-line heat exchanger 510 can be substantially increased. In addition to increasing the surface area of the inner wall of the gas heating/cooling pipe, the space available for inserting an array of heat transfer fins is also increased. For example, the heat transfer fins (thermal membrane 580) can be composed of an array of concentric (tubular) fins of radial spacing r or a honeycomb structure of through-hole cross-section $d_h$.

For a gas flow rate of 500 sccm (argon) and a typical gas injection design for a plasma processing device, the gas pressure will be approximately 10 Torr (to first order) at the entrance to the in-line gas heat exchanger 510. At these reduced pressures, the gas flow can be treated as a (viscous) continuum flow when the Knudsen number is less than 0.01. At a pressure of 10 Torr, the mean free path is approximately 0.005 mm and, therefore, radial fin spacings r or honeycomb through-hole diameters $d_h$ greater than 0.5 mm (for example) would allow design of the in-line gas heat exchanger 510 unit using continuum flow principles (which is preferred since the heat transfer coefficient decreases significantly when the Knudsen number increases above approximately 0.01; i.e. the mean free path is becoming large relative to the flow structure). For example, an in-line gas heat exchanger 510 of length 10 cm and diameter 4 cm provides sufficient space to insert approximately nineteen (19) concentric, tubular fins spaced by r~0.5 mm (given a finite thickness for the fins) such that a total "wetted" surface area of 0.25 $m^2$ is achieved. Given this amount of "wetted" surface area and a laminar flow assumption, the heat transfer will be sufficiently great that the gas temperature will reach the structure temperature prior to the exit of the in-line gas heat exchanger 510. Therefore, the gas exit temperature will assume the temperature of the thermal transfer membrane(s). The thermal transfer membrane structure 580 should be fabricated as a low thermal inertia structure from a material of high thermal conductivity as described above. In summary, the exit gas temperature will be limited by the temperature constraints of the materials comprising the in-line gas heat exchanger 510. Incorporating longer in-line heat exchangers 510 allows a greater maximum heat exchange due to an increase in heat transfer surface area in contact with the passing gas, namely thermal transfer membrane 580, membrane support 550, and, to a lesser degree, heat conductor 515. Lastly, the length of the conically convergent (nozzle) section can be less than that of the diffuser section. The nozzle reduces the flow-through cross-section to the inner diameter of the gas plumbing $505_o$.

In an alternate embodiment, a series of heat conducting screens or baffle plates can replace the thermal transfer membrane and the membrane supports. In addition, a different number of channels can be used and/or a different number of temperature sensors can be used. Also, the O-rings can be replaced with another sealing mechanism or they can be eliminated.

Figure 6:
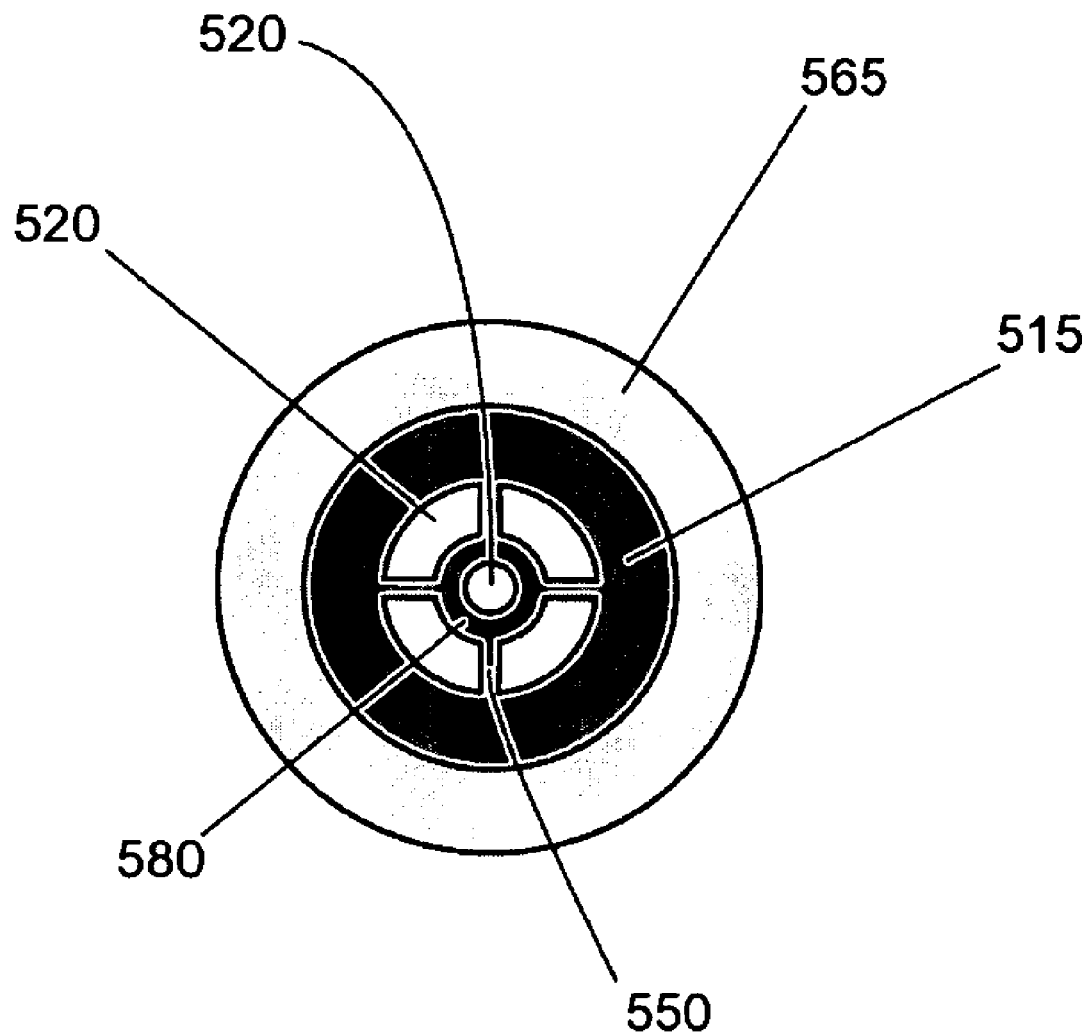
FIG. 6 is a cross section of the diameter of the temperature controller of FIG. 5.

FIG. 6 shows an exemplary cross sectional view of a gas temperature controller 500, and includes gas through-channel 520, insulation 565, heat-conducting metal 515, membrane support 550, and a single thermal transfer membrane 580. As described above, additional fins can be required.

In operation, the dimensions of gas through-channel 520, heat-conductor 515, and membrane supports 550 are designed such that the volume of the gas through-channel yields the same impedance to the flow of gas as that of the gas line into which the temperature controller is disposed. As would be apparent to one of ordinary skill, the number of concentric channels can be varied to carry different gases or the same gas. Moreover, insulators may thermally isolate the heat transfer to one channel from another channel in an alternate embodiment.

In yet another alternate embodiment, the heat exchanger is not a linear heat exchanger but a serpentine exchanger wherein the gas flows back and forth while being heated or cooled. This enables heat exchange over a shorter linear distance for compact form factors or designs.

Figure 7:
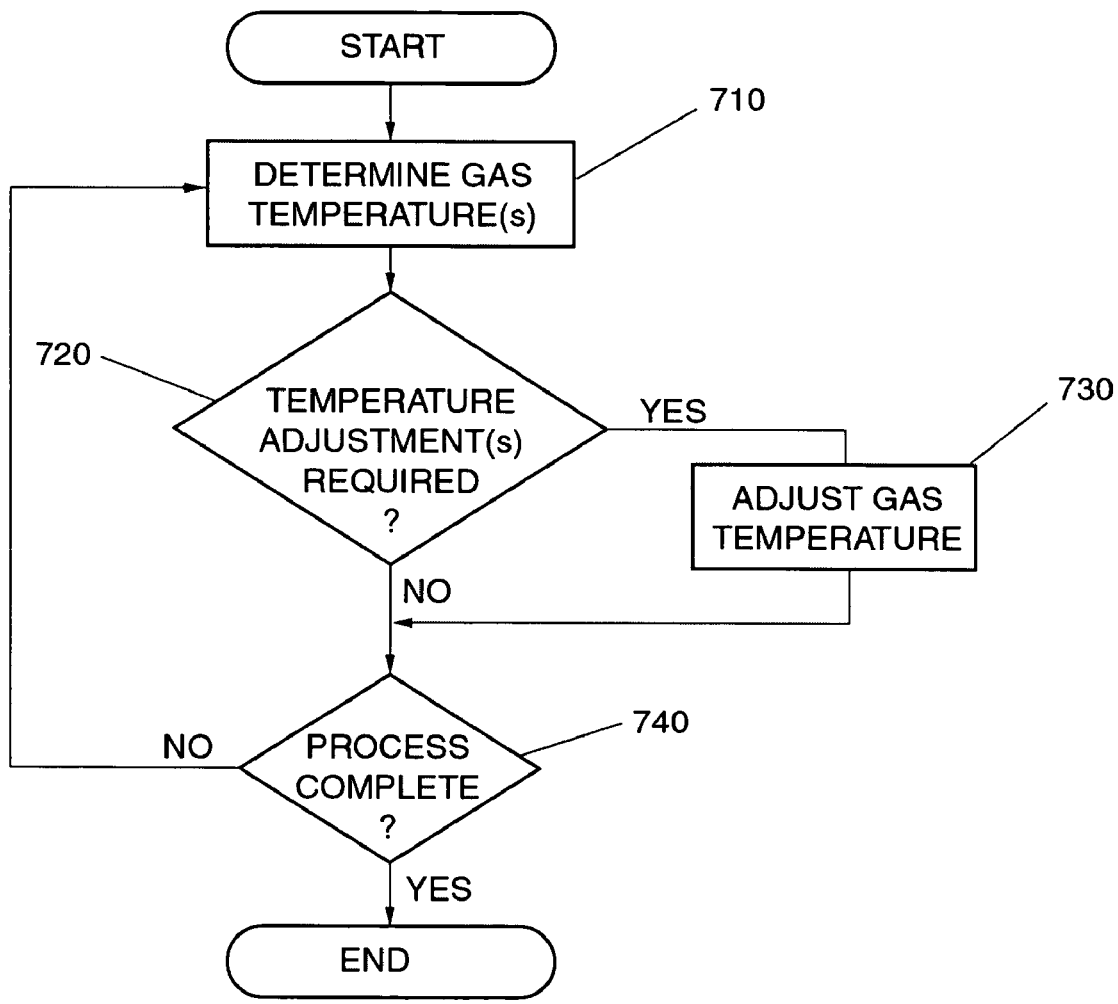
FIG. 7 is a flowchart illustrating temperature regulation according to the present invention.

FIG. 7 shows a method of controlling the temperature of gas species flowing through at least one in-line heat exchanger assembly of a temperature controller. The procedure or FIG. 7 starts by selecting a process type and initiating the flow of a process gas according to the process type.

In step 710, control unit 590 senses the temperature of in-line heat exchanger 510 communicated by temperature sensors $570_i$ and $570_o$.

In step 720, control unit 590 compares the measured temperature with the desired temperature in the process recipe stored in the memory in control unit 590. If the results of the comparison indicate that a temperature adjustment is required, then control passes to step 730; otherwise, control passes to step 740. Control unit 590 sends comparison data to a process controller (not shown). In addition, control unit 590 determines if the temperature adjustment can be made and reports the results to the process controller. In a preferred embodiment, gas temperatures operate within ranges established for each process. Control unit 590 receives temperature range data from a process controller. In step 730, control unit 590 instructs heater 585 to provide power to heating element 530 or control unit 590 instructs cooler 588 to supply a flow of cooling gas or liquid through cooling element 535.

In step 740, control unit 590 determines if the process is complete. If the process is complete, controller 590 communicates to heater 585 and cooler 588 to cease operation and procedure 700 as shown in FIG. 7. If the process is not complete, procedure 700 branches to step 710, and continues as shown in FIG. 7.

Numerous modifications and variations of the present invention are possible in light of the above teachings. It is therefore to be understood that within the scope of the appended claims, the invention may be practiced otherwise than as specifically described herein.

The invention claimed is:

1. A method for etching by operating a temperature controller coupled to an etch process chamber, the method comprising:

determining an etch process type;

supplying an etch gas to the process chamber through a double helix structure in-line heat exchange assembly, the etch gas being determined from the etch process type, wherein the double helix structure in-line heat exchange assembly includes an inlet side temperature sensor and an outlet side temperature sensor, at least one helically wound heating element and at least one helically wound cooling element separate from the heating element, the helically wound heating element and helically wound cooling element together forming the double helix structure;

determining a desired gas temperature for the etch gas using the etch process type;

determining the etch gas temperature in the in-line heat exchange assembly by sensing a temperature of the etch gas entering the heat exchange assembly and sensing a temperature of the etch gas exiting the heat exchange assembly;

comparing the etch gas temperature to the desired etch gas temperature using a control unit coupled to the in-line heat exchange assembly computing heat to be transferred to or from the gas as a function of power delivered to the heating element or flow rate and temperature of coolant in the cooling element, said computing being based on the sensed temperatures and the desired temperature; and adjusting the etch gas temperature in the in-line heat exchange assembly when the comparison indicates that a temperature adjustment is required, said adjusting based on the computed heat to be transferred including actively heating the etch gas using the at least one heating element and actively cooling the etch gas using the at least one cooling element to provide the desired etch gas temperature.

2. The method according to claim 1, the method further comprising:

supplying a second gas to the process chamber through the in-line heat exchange assembly, the second gas being determined from the etch process type;

determining a desired gas temperature for the combined etch and second gasses using the process type;

determining gas temperature for the combined gasses in the in-line heat exchange assembly;

comparing the gas temperature for the combined gasses to the desired gas temperature for the combined gasses using a control unit coupled to the in-line heat exchange assembly; and adjusting the gas temperature for the combined gasses in the in-line heat exchange assembly when the comparison indicates that a temperature adjustment is required.

3. The method according to claim 1, the method further comprising:

supplying a second gas to the process chamber through a second in-line heat exchange assembly, the second gas being determined from the etch process type;

determining a desired gas temperature for the second gas using the etch process type;

determining gas temperature for the second gas in the second in-line heat exchange assembly;

comparing the gas temperature for the second gas to the desired gas temperature for the second gas using a control unit coupled to the in-line heat exchange assembly; and adjusting the gas temperature for the second gas in the second in-line heat exchange assembly when the comparison indicates that a temperature adjustment is required.

4. The method according to claim 1, wherein said determining the etch gas temperature comprises determining the etch gas temperature at different spatial locations of the etch gas entering the etch process chamber.

5. The method according to claim 4, wherein said adjusting comprises adjusting the etch gas temperature independently at said different spatial locations.

6. The method according to claim 1, wherein said in-line heat exchange assembly includes only one gas through channel and said at least one heating element and at least one cooling element are provided at alternate positions along the gas through channel, the method further comprising:

activating the at least one heating element at a first time to heat the etch gas passing through the gas through channel; and activating the at least one cooling element at a second time different from the first time to cool the etch gas passing through the gas through channel.

* * * * *